United States Patent
Jiang et al.

(10) Patent No.: US 12,045,552 B2
(45) Date of Patent: Jul. 23, 2024

(54) LAYOUT METHOD OF A CHIP AND ELECTRONIC EQUIPMENT

(71) Applicants: BEIJING BOE OPTOELECTRONICS TECHNOLOGY CO., LTD., Beijing (CN); BOE TECHNOLOGY GROUP CO., LTD., Beijing (CN)

(72) Inventors: Qianwen Jiang, Beijing (CN); Hao Zhang, Beijing (CN); Lili Chen, Beijing (CN); Peng Han, Beijing (CN); Huidong He, Beijing (CN); Juanjuan Shi, Beijing (CN)

(73) Assignees: BEIJING BOE OPTOELECTRONICS TECHNOLOGY CO., LTD., Beijing (CN); BOE TECHNOLOGY GROUP CO., LTD., Beijing (CN)

( * ) Notice: Subject to any disclaimer, the term of this patent is extended or adjusted under 35 U.S.C. 154(b) by 414 days.

(21) Appl. No.: 17/396,285

(22) Filed: Aug. 6, 2021

(65) Prior Publication Data
US 2022/0050949 A1    Feb. 17, 2022

(30) Foreign Application Priority Data

Aug. 13, 2020 (CN) .......................... 202010812473.7

(51) Int. Cl.
*G06F 30/392* (2020.01)
*G06N 20/00* (2019.01)

(52) U.S. Cl.
CPC ........... *G06F 30/392* (2020.01); *G06N 20/00* (2019.01)

(58) Field of Classification Search
CPC ...... G06F 30/392; G06F 30/27; G06F 30/394; G06F 30/398; G06F 18/24; G06N 20/00; G06N 3/044; G06N 3/08; G06N 3/045
See application file for complete search history.

(56) References Cited

U.S. PATENT DOCUMENTS

| | | | |
|---|---|---|---|
| 9,916,408 B2 * | 3/2018 | Fawaz | G06F 30/39 |
| 10,628,546 B1 * | 4/2020 | Colwell | G06F 30/27 |
| 2017/0344669 A1 * | 11/2017 | Jeong | G06F 30/3323 |
| 2020/0004921 A1 | 1/2020 | Baidya et al. | |

* cited by examiner

*Primary Examiner* — Nghia M Doan
(74) *Attorney, Agent, or Firm* — Dority & Manning, P.A.

(57) ABSTRACT

A layout method of a chip includes: determining a logic diagram corresponding to a chip to be laid out and a device list corresponding to the logic diagram; and determining a layout diagram of the chip to be laid out, according to the logic diagram, the device list, and a pre-trained layout mode. The layout diagram includes at least an arrangement position, in the chip to be laid out, of each device in the device list.

13 Claims, 4 Drawing Sheets

---

S101 — Determine a logic diagram corresponding to a chip to be laid out and a device list corresponding to the logic diagram S102 — Determine the layout diagram of the chip to be laid out, according to the logic diagram corresponding to the chip to be laid out, the device list corresponding to the logic diagram, and a pre-trained layout model

LAYOUT METHOD OF A CHIP AND ELECTRONIC EQUIPMENT

CROSS-REFERENCE TO RELATED APPLICATION

This application claims priority to Chinese Patent Application No. 202010812473.7, filed on Aug. 13, 2020, which is incorporated herein by reference in its entirety.

TECHNICAL FIELD

The present disclosure relates to the technical field of chip design, and in particular, to a layout method of a chip and an electronic equipment.

BACKGROUND

A chip refers to a silicon chip containing integrated circuits, and is often used as a part of a computer or other electronic equipments for its low power consumption, small volume and fast operation speed. In the process of producing a chip, the layout of the chip is a complex and time-consuming task, because the process involves integrated circuit logic and various devices for realizing the circuit logic, and equipment properties and principles of circuit design also need to be taken into account.

SUMMARY

In an aspect, the present disclosure provides a layout method of a chip. The method includes determining a logic diagram corresponding to a chip to be laid out and a device list corresponding to the logic diagram; and determining a layout diagram of the chip to be laid out, according to the logic diagram, the device list, and a pre-trained layout model. The layout diagram includes at least an arrangement position, in the chip to be laid out, of each device in the device list.

In another aspect, the present disclosure further provides an electronic equipment. The electronic equipment includes: at least one processor, a memory, and computer instructions stored in the memory and executable on the at least one processor. The computer instructions, when executed by the at least one processor, cause the at least one processor to perform one or more steps of the layout method of a chip described as above.

In yet another aspect, the present disclosure further provides a non-transitory computer-readable storage medium. The non-transitory computer-readable storage medium stores thereon one or more computer programs, and the one or more computer programs include computer instructions that, when executed by a processor, cause the processor to perform one or more steps of the layout method of a chip described as above.

In yet another aspect, the present disclosure further provides a computer program product. The computer program product includes computer instructions stored in a non-transitory computer-readable storage medium, and the computer instructions, when executed on a computer, cause the computer to perform one or more steps of the layout method of a chip described as above.

BRIEF DESCRIPTION OF THE DRAWINGS

In order to describe technical solutions in the present disclosure or the prior art more clearly, accompanying drawings to be used in the description of the embodiments or the prior art will be introduced briefly. However, the accompanying drawings to be described below are merely some embodiments recorded in the present disclosure, and a person of ordinary skill in the art can obtain other drawings according to those drawings without paying any creative effort.

DETAILED DESCRIPTION

For the clarity of the purpose, technical solutions and advantages of the present disclosure clearer, the technical solutions in the present disclosure will be described clearly with reference to the accompanying drawings in the present disclosure. However, the described embodiments are merely some but not all of embodiments of the present disclosure. All other embodiments made on the basis of the described embodiments of the present disclosure by a person of ordinary skill in the art without paying any creative effort shall be included in the protection scope of the present disclosure.

Unless defined otherwise, technical or scientific terms used in the present disclosure shall have the ordinary meaning as understood by one of ordinary skill in the art to which the present disclosure belongs. "First", "second" and similar words used in the present disclosure do not indicate any order, quantity, or importance, but are only used to distinguish different components. The "comprise" or "contain" and similar words, intends to mean that the elements or articles appeared before this word encompass the elements or articles or the equivalent thereof listed after this word, rather than to exclude other elements or articles. The "connected" or "coupled" and similar words do not intend to be restricted to physical or mechanical connections, but may include electrical connections, whether directly or indirectly. To keep the following description of the present disclosure clear and concise, the present disclosure omits a detailed description of known functions and known components.

As used in this specification and the appended claims, the singular forms "a," "an," and "the" include plural referents unless the content clearly dictates otherwise.

In some embodiments, a chip is laid out in a manual layout mode. In this case, an arrangement position of a device in the chip is based on a process of testing-checking-correcting-retesting, which is implemented by a professional according to a known logic diagram of the chip. Since the layout of a chip usually needs a plurality of devices, and arrangement positions of the devices may affect each other, the layout of the chip in the manual layout mode is not only time-consuming, but also low in efficiency. In addition, facing the complicated layout process, even professionals may make mistakes, which results in poor accuracy of the chip layout.

Some embodiments of the present disclosure provide a layout method of a chip. A use of the method in the process of chip layout may improve an efficiency and accuracy of the chip layout, and save costs to a certain extent. In the following, the layout method will be described in detail.

Figure 1:
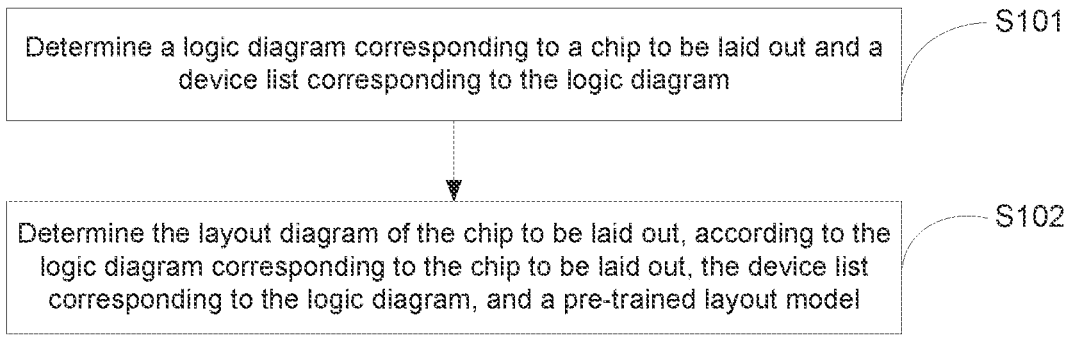
FIG. 1 shows a flow diagram of a layout method of a chip in some embodiments.

FIG. 1 shows a flow diagram of a layout method of a chip, in accordance with some embodiments of the present disclosure, and the method includes step 101 (S101) and step 102 (S102).

In S101, a logic diagram corresponding to a chip to be laid out and a device list corresponding to the logic diagram are determined.

In some embodiments, according to the desired function of the chip to be laid out and in combination with a use environment of the chip to be laid out, a logic diagram may be determined accordingly, which is called the logic diagram corresponding to the chip to be laid out. A logic diagram, also referred to as a logic circuit or a logic circuit diagram, consists of several logic elements, and performs logical operations. Generally, a logic diagram has several input terminals and one or more output terminals. When a certain logic relationship is satisfied between inputs of signals, an output is generated; otherwise, there is no output. The logic operations include logic gates and storage circuits, the logic gates include a AND gate, an OR gate, a NOT gate, and combination operations thereof (e.g., the AND-NOT gate, and the OR-NOT gate). The storage circuits are circuits with information-storing function, such as a flip-flop, a register, and a counter.

After the logic diagram corresponding to the chip to be laid out is determined, the device list corresponding to the logic diagram may be determined according to the logic diagram. In some embodiments, the device list includes information about the devices required for the layout of the chip, such as specification, quantity, or power of each type of devices. The devices include circuit elements (such as a transistor, a resistor, and a capacitor) and electron devices (such as a light-emitting diode, a transistor, and a semiconductor integrated circuit).

For example, the devices required for the layout of the chip may be determined through the instantiation of the logic elements in the logic diagram. The aim of the instantiation of the logic elements in the logic diagram is to transform the logic elements into corresponding circuit elements and/or electron devices that can realize the function of the logic elements. These circuit elements and/or electron devices may be classified, the same devices are classified into one category, and different devices are classified into different categories. Thus, the device list is then obtained. The device list also shows the number of the devices in each category of devices.

In S102, the layout diagram of the chip to be laid out is determined according to the logic diagram corresponding to the chip to be laid out, the device list corresponding to the logic diagram, and a pre-trained layout model. The layout diagram includes at least an arrangement position, in the chip to be laid out, of each device in the device list.

For example, a logic diagram corresponding to the chip to be laid out and the device list corresponding to the logic diagram may be input into the pre-trained layout model, and preset parameters and calculation rules in the layout model may be used for calculation to obtain the layout diagram of the chip to be laid out.

Figure 2:
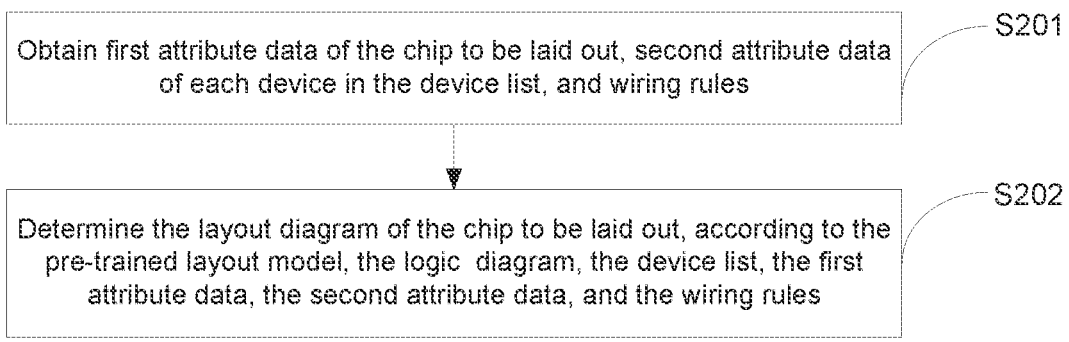
FIG. 2 shows sub-steps of step 102 (S102) in a layout method of a chip in some embodiments.

In a possible implementation manner, referring to FIG. 2, that a layout diagram of the chip to be laid out is determined according to the logic diagram corresponding to the chip to be laid out, the device list corresponding to the logic diagram, and the pre-trained layout model (i.e., S102) may include step 201 (S201) and step 202 (S202).

In S201, first attribute data of the chip to be laid out, second attribute data of each device in the device list, and wiring rules are obtained.

The use environment of the chip to be laid out may impose certain requirements on the chip to be laid out, for example, a size of the chip to be laid out is not allowed to exceed a preset size, a working power of the chip to be laid out is not allowed to exceed a power rating, and some attribute data of each device possibly affecting realization of a function. Therefore, in the layout process of the chip, it is necessary to obtain the first attribute data of the chip to be laid out and the second attribute data of each device. The first attribute data includes at least an area of the chip to be laid out. Optionally, the first attribute data may further include the size of the chip to be laid out. The second attribute data of a device includes at least power consumption of the device, performance of the device, and a size of the device. The performance of the device includes at least temperature, humidity, and pressure that the device can withstand when operating.

Since the chip layout involves the arrangement positions and connections of actual devices in the chip, certain wiring rules also need to be followed in the layout process of the chip, such as a wiring density limitation, an interconnection principle, and a non-crossing principle.

In S202, the layout diagram of the chip to be laid out is determined according to the pre-trained layout model, the logic diagram, the device list, the first attribute data, the second attribute data, and the wiring rules.

After the first attribute data, the second attribute data, and the wiring rules are obtained, the layout diagram of the chip to be laid out is determined through the pre-trained layout model, according to the logic diagram, the device list, the first attribute data, the second attribute data, and the wiring rules. In this way, it is possible to ensure the accuracy of the layout diagram, that is, accuracy of the chip layout is ensured.

Figure 3:
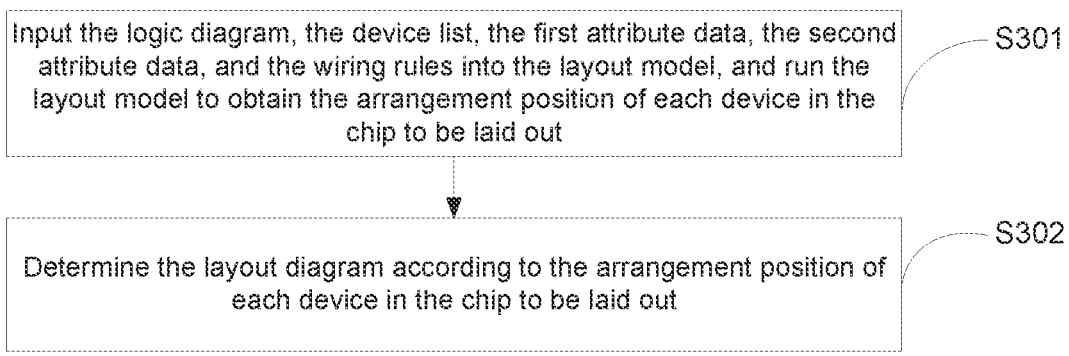
FIG. 3 shows sub-steps of step 202 (S202) in a layout method of a chip in some embodiments.

In a possible implementation manner, referring to FIG. 3, that the layout diagram of the chip to be laid out is determined according to the pre-trained layout model, the logic diagram, the device list, the first attribute data, the second attribute data, and the wiring rules (i.e., S202) may include step 301 (S301) and step 302 (S302).

In S301, the logic diagram, the device list, the first attribute data, the second attribute data, and the wiring rules are input into the layout model, and the layout model is run to obtain the arrangement position of each device in the chip to be laid out.

The logic diagram, the device list, the first attribute data, the second attribute data, and the wiring rules are used as inputs of the layout model to run the layout model, and outputs of the layout model are the arrangement positions of the devices. For example, the layout model may include a recursive neural network. According to the recursive neural network, each time the layout model is run, an arrangement position of one device may be output, and an arrangement position output this time will affect an arrangement position output next time. For example, an arrangement position output at the first time may affect an arrangement position output at the second time, and the arrangement position output at the second time may affect an arrangement position output at the third time. The device corresponding to the arrangement position output at the first time by the layout model may be any device in the device list. Alternatively, the device corresponding to the arrangement position output at the first time may be a device determined based on the logic diagram, for example, a device corresponding to a node that performs the most operations in the logic diagram. Alternatively, the device corresponding to the arrangement position output at the first time may also be a device determined based on the device list, for example, one of a type of devices with a smallest number in the device list.

In S302, the layout diagram is determined according to the arrangement position of each device in the chip to be laid out.

After the arrangement position of a device in the chip to be laid out is determined, according to the arrangement position of the device, a corresponding node (which can represent the device) is placed onto a chip canvas. After all corresponding nodes are placed onto the chip canvas, the layout diagram of the chip to be laid out is obtained. For example, the layout diagram may be obtained using design software through simulation placement. In some embodiments, the arrangement position of each device and connections among the devices may also be described in a form of a list, or other forms that can represent the placement and connections of the devices.

In the embodiments of the present disclosure, the logic diagram corresponding to the chip to be laid out and the device list corresponding to the logic diagram are determined firstly, and then the pre-trained layout model, the logic diagram, and the device list are used in chip layout, so that the layout diagram of the chip to be laid out may be obtained quickly. Compared with the manual chip layout, the embodiments of the present disclosure greatly shorten time required for chip layout and improves an efficiency of the chip layout. In addition, the layout method of a chip provided by the embodiments of the present disclosure is implemented based on the layout model, and the layout diagram may be obtained through machine operations. Compared with the manual chip layout, calculation accuracy of the embodiments of the present disclosure is higher, that is, the accuracy of the chip layout is improved. Since there are some irreversible operations in the process of actual layout of the chip, for example, the device is disposable, that is, the device cannot be detached for reuse after being placed on the chip to be laid out, in a case of high accuracy of the chip layout, material waste caused by some irreversible operation errors may be avoided to a certain extent, thereby saving costs.

Figure 4:
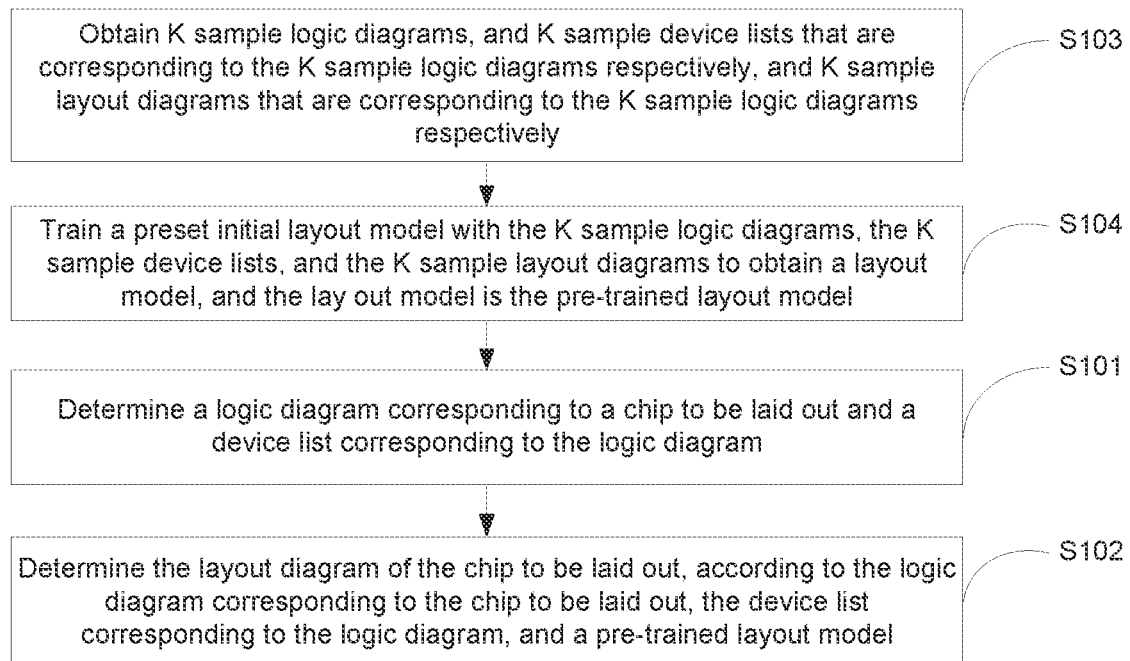
FIG. 4 shows a flow diagram of another layout method of a chip in some embodiments.

In some embodiments, as shown in FIG. 4, before the layout diagram of the chip to be laid out is determined according to the logic diagram, the device list, and the pre-trained layout model, the method may further include step 103 (S103) and step 104 (S104).

In S103, K sample logic diagrams, and K sample device lists that are corresponding to the K sample logic diagrams respectively, and K sample layout diagrams that are corresponding to the K sample logic diagrams respectively are obtained.

A sample logic diagram is a historical logic diagram of a chip that has been laid out, for example, a historical logic diagram that has been applied to practical use for a period. On this basis, since a sample layout diagram corresponding to the historical logic diagram is accurate, subsequent model training based on the historical logic diagram and a device list corresponding to the historical logic diagram may ensure accuracy of a layout model obtained through the model training. In the embodiments of the present disclosure, categories of the K sample logic diagrams may be the same or different, and the categories of the sample logic diagrams may be classified based on the use environment, the use purpose, etc. Certainly, if categories of training samples are the same, that is, a layout model is trained with the same type of sample logic diagrams, a layout diagram, output by the layout model based on the same type of sample logic diagram, is more accurate and targeted. If the categories of the training samples are different, that is, a layout model is trained with various categories of sample logic diagrams, the layout model may be applicable for various application scenes, and has strong applicability.

In addition, in training process, since the sample logic diagram is the historical logic diagram of a chip that has been laid out, the sample device list corresponding to the sample logic diagram is known.

In S104, a preset initial layout model is trained with the K sample logic diagrams, the K sample device lists, and the K sample layout diagrams to obtain a layout model, and the lay out model is the pre-trained layout model.

The initial layout model is an untrained existing layout model.

Figure 5:
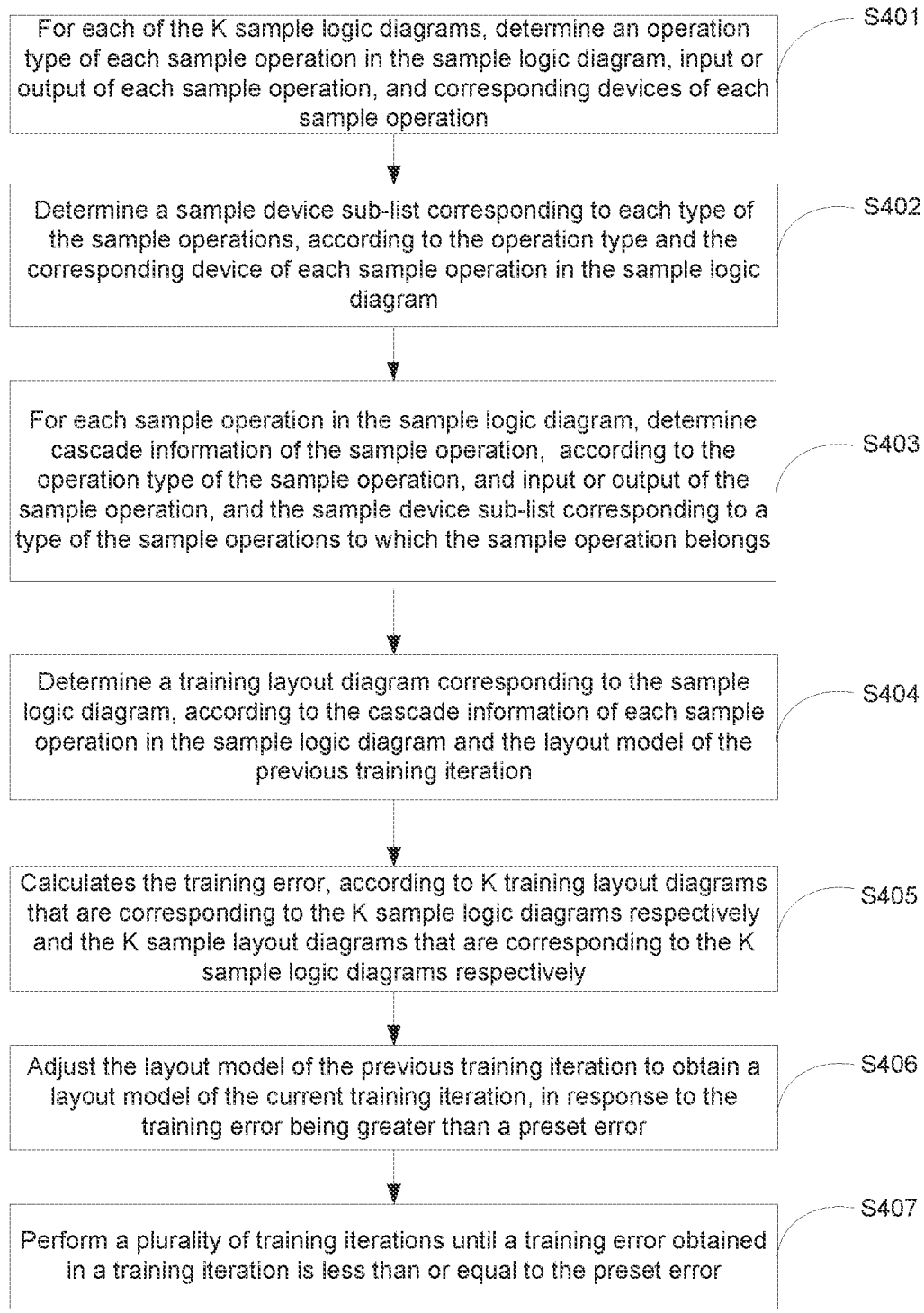
FIG. 5 shows a flow diagram of training a layout model in some embodiments.

In some embodiments, as shown in FIG. 5, that the preset initial layout mode is trained with the K sample logic diagrams, the K sample device lists, and the K sample layout diagrams to obtain a layout model (i.e., S104) includes steps 401 to 407 (S401 to S407).

In S401, for each of the K sample logic diagrams, an operation type of each sample operation in the sample logic diagram, input or output of each sample operation, and corresponding devices of each sample operation are determined.

For example, each sample logic diagram may include multiple sample operations, and each sample operation may correspond to a device in the device list, and the device is an operation object of the sample operation. For example, the sample operation may be inputting the output of a certain node into a device 1, or inputting the output of a device 2 into a certain node, etc. Accordingly, the device corresponding to the above sample operation is the device 1 and the device 2.

For each sample logic diagram, a sample operation of the sample logic diagram is classified to obtain an operation type of the sample operation. The operation type of the sample operation may be AND operation, OR operation, NOT operation, cycle operation, interruption, etc. In some embodiments, in a training process of the layout model, the operation type may be represented by an embedded vector with a direction, and a sample operation in a type of sample operations may be represented by adjusting a parameter and/or a direction in the embedded vector.

In S402, according to the operation type and the corresponding device of each sample operation in the sample logic diagram, a sample device sub-list corresponding to each type of the sample operations is obtained.

After all the sample operations in the sample logic diagram are classified, each type of the sample operations includes one or more sample operations. For any type of the sample operations, a sample device sub-list corresponding to the type of the sample operations may be determined according to the device corresponding to each sample operation in the type of the sample operations, and the sample device sub-list corresponding to the type of the sample operations is a device sub-list corresponding to the operation type. That is to say, the sub-device list sample corresponding to each type of the sample operations includes the device corresponding to each sample operation in the type of the sample operations.

Each sample operation has an input or an output, hence, a vector may also be used to represent the input or the output.

In S403, for each sample operation in the sample logic diagram, cascade information of the sample operation is determined according to the operation type of the sample operation, and input or output of the sample operation, and the sample device sub-list corresponding to a type of the sample operations to which the sample operation belongs.

For example, for each sample operation, an embedded vector corresponding to the operation type of the sample operation, the sub-device list sample corresponding to the type of sample operations to which the sample operation belongs, and a vector corresponding to the input or output of the sample operation may be combined, for example, combined through sequential superposition, so as to obtain the cascade information. The cascade information may also be a vector, and can simultaneously identify an operation type of an sample operation, a sample device sub-list corresponding to a type of sample operations to which the sample operation belongs, and an input or output of the sample operation.

In S404, a training layout diagram corresponding to the sample logic diagram is determined according to the cascade information of each sample operation in the sample logic diagram and the layout model of the previous training iteration.

For example, for each sample logic diagram, the layout model obtained in the previous training iteration may be used to calculate the cascade information of each sample operation in the sample logic diagram, so as to obtain the arrangement position of each device, and further obtain the training layout diagram corresponding to the sample logic diagram, and the training layout diagram is a training result of the current training iteration. The layout model may include preset parameters and calculation rules used in the training.

To obtain the layout model of the previous training iteration, reference may be made to following steps S405 and S406. It should be noted that, for the first training iteration, the layout model of the previous training iteration is the initial layout model.

In the current training iteration, it is possible to determine the corresponding training layout diagram of each sample logic diagram. In addition, each sample logic diagram has a corresponding sample layout diagram (for example, the sample layout diagram may be a historical sample layout diagram of the sample logic diagram), and the sample layout diagram is an actual layout diagram designed for the sample logic diagram. A training error may be calculated according to the training layout diagram corresponding to each sample logic diagram and the sample layout diagram corresponding to each sample logic diagram (referring to S405).

In S405, the training error is calculated according to K training layout diagrams that are corresponding to the K sample logic diagrams respectively and the K sample layout diagrams that are corresponding to the K sample logic diagrams respectively.

The training error may represent a deviation between a position of each device in the training layout diagram and a position of each device in the sample layout diagram. The larger the training error is, the larger the deviation between the position of the device in the training layout diagram and the position of the device in the sample layout diagram is. It will be understood that both an angle and a distance of the deviation of each device will influence the training error. For example, when the training error is determined, a sub-error corresponding to each sample logic diagram may be calculated, and thus K sub-errors corresponding to the K sample logic diagrams are obtained. In some examples, the training error may include the K sub-errors. In some examples, the training error may include a total error calculated according to the K sub-errors, for example, the total error may be a summation error or an average error of the K sub-errors. The embodiments of the present disclosure do not specifically limit to the training error, as long as a layout model training may be obtained based on the training error.

In S406, in response to the training error being greater than a preset error, the layout model of the previous training iteration is adjusted to obtain a layout model of the current training iteration, and the layout model of current training iteration is used in the next training iteration.

In S407, a plurality of training iterations are performed until a training error obtained in a training iteration is less than or equal to the preset error, a layout model of the previous training iteration of the training iteration is the pre-trained layout model.

In a training iteration, after the training error is determined based on the layout model of the previous training iteration, the training error is compared with the preset error. In a case where the training error is greater than the preset error, it indicates that accuracy of the layout model of the previous training iteration is low. It is necessary to adjust model parameters of the layout model to obtain the layout model of the current training iteration and to begin the next training iteration. And for the next training iteration, the layout model of the current training iteration is the layout model of the previous training iteration. In the next training iteration, S401 to S405 are performed again to obtain a training error, and if the training error is less than or equal to the preset error, the training process of the layout model is finished, and the layout model obtained in the previous training iteration is the pre-trained layout model. Otherwise, S406 is perfumed to adjust model parameters so that a new layout model is obtained. It will be noted that in a case where the plurality of sub-errors are used for training, each sub-error may be compared with the preset error. If any of a plurality of sub-error values is greater than the preset error, the current layout model may be considered to be unreasonable and it is necessary to adjust the current layout model. Once all the K sub-errors are less than the preset error, the training process is finished.

It is worth to note that, in a case where the first attribute data, the second attribute data, and the wiring rules are fixed, the first attribute data, the second attribute data, and the wiring rules may be directly embedded in the layout model, and it is unnecessary to repeat input them in each training iteration, which can improve a training efficiency to a certain extent.

In some examples, that the layout model of the previous training iteration is adjusted to obtain the layout model of the current training iteration includes:

adjusting the model parameters of the layout model corresponding to the previous training using a preset formula to obtain the layout model corresponding to the current round of training.

The preset formula includes:

$$\nabla_u J(u) = \frac{1}{K} \sum_{i=1}^{K} \left( \sqrt{r(P_i)} - B \right) \cdot \nabla_u \log_p(P_i \mid G; u),$$

where K is a number of the sample logic diagrams; $r(P_i)$ is a sample layout duration of a layout based on the i-th sample logic diagram; B is a time baseline of the i-th sample logic diagram; and u is input or output of a sample operation in the i-th of the sample logic diagram.

By utilizing the layout model optimized by the above formula, it is possible to obtain accurate model parameters, and further optimize a use effect of the layout model, and improve the accuracy of the chip layout.

In some examples, a machine translation neural network, a convolutional neural network, or the like may be used to train the layout model. According to training and verification, if a machine translation neural network is adopted for chip layout and 4 graphics processing units (GPUs) are used for verification, compared with a speed of the manual chip layout, a speed of the embodiments of the present disclosure on determining the arrangement position of one device is increased by 20.6%; and when a convolutional neural network is adopted for chip layout and 4 GPUs are used for verification, compared with a speed of the manual chip layout, the speed of the embodiments of the present disclosure on determining the arrangement position of one device is increased by 16.3%. It is clear that different neural networks have different effects, as long as the layout diagram chosen to be output finally is relatively accurate and a layout duration is relatively short.

Figure 6:
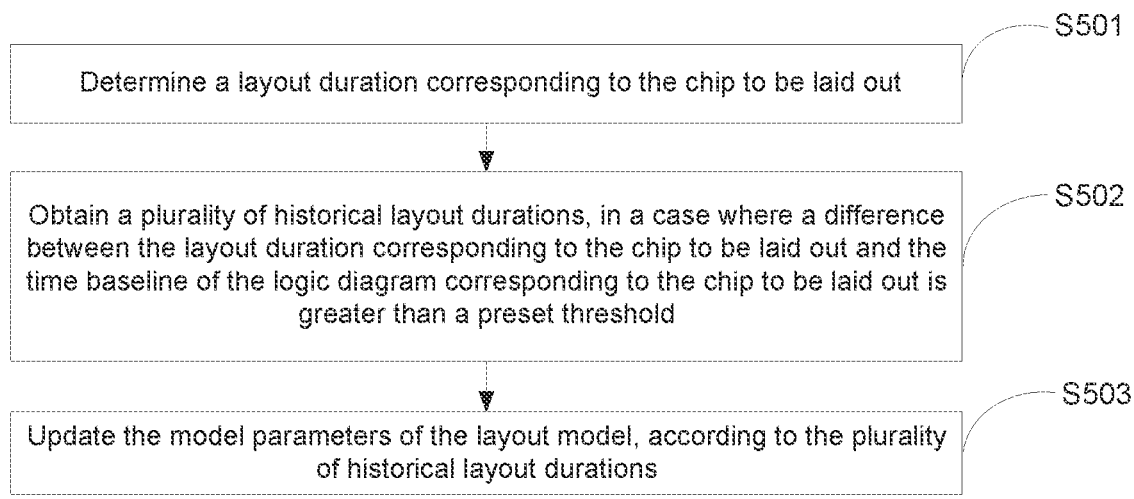
FIG. 6 shows a flow diagram of updating a layout model in some embodiments.

In some embodiments, the layout model may be updated periodically or in real time to improve the accuracy of its output, thereby ensuring the accuracy and efficiency of the layout model. For example, as shown in FIG. 6, updating the layout model may include steps 501 to 503 (S501 to S503).

In S501, a layout duration corresponding to the chip to be laid out is determined.

The layout duration corresponding to the chip to be laid out refers to time used for determining the layout diagram of the chip to be laid out, i.e., a time difference between a first moment when the logic diagram corresponding to the chip to be laid out is input into the layout model and a second moment when the layout model outputs arrangement positions of all devices. For example, the layout duration may be determined by a timer, that is, the timer starts timing when the logic diagram corresponding to the chip to be laid out is input into the layout model, and the timer stops timing when the layout model outputs the arrangement positions of all the devices. In this way, the timer may obtain the layout duration corresponding to the chip to be laid out.

In S502, in a case where a difference between the layout duration corresponding to the chip to be laid out and the time baseline of the logic diagram corresponding to the chip to be laid out is greater than a preset threshold, a plurality of historical layout durations are obtained.

The plurality of historical layout durations are layout durations corresponding to the chip in the previous layouts. For example, when the chip is laid out each time, a layout duration corresponding to the chip to be laid out may be determined by using a timer, and the layout duration is stored. After it is determined that the plurality of historical layout durations will be used in the following process, the stored plurality of historical layout durations are read out.

The time baseline of the logic diagram is a theoretical layout duration corresponding to the chip to be laid out that is predetermined according to the logic diagram corresponding to the chip to be laid out.

In addition, if the difference between the layout duration corresponding to the chip to be laid out and the time baseline of the logic diagram is greater than a preset threshold, it indicates that there is a deviation of the arrangement positions of one or more devices in the current layout diagram, and an abnormality may occurs in the model parameters of the layout model due to some previous layout. In this case, the model parameters of the layout model may be updated in time. That is, S503 is performed.

In S503, the model parameters of the layout model are updated according to the plurality of historical layout durations.

In some embodiments, the model parameters of the layout model may be updated in real time. That is, after each chip layout is completed, the model parameters of the layout model are updated according to the layout duration of the current chip to be laid out and the plurality of historical layout durations.

In some other embodiments, the model parameters of the layout model may also be periodically updated. That is, each time preset times of chip layout is completed, the model parameters of the layout model are updated according to the layout duration of the current chip to be laid out and the plurality of historical layout durations.

In an example, updating the model parameters of the layout model according to the plurality of historical layout durations may be: determining whether the difference between the layout duration and the time baseline of the logic diagram in the previous layout process is greater than a preset threshold. If not, it is determined that the previous layout causes an abnormality of the model parameters of the layout model. In this case, the layout model may be used to lay out the chip in the previous layout and adjust the model parameters of the layout model, so as to adjust the abnormality of the layout model. Of course, if the difference between the layout duration and the time baseline of the logic diagram is greater than the preset threshold in the previous layout process, whether the abnormality occurs in the model parameters of the layout model in the previous layout process of the current layout may be sequentially checked, and by analogy, until a node that causes the abnormality of the model parameters of the layout model is determined.

For example, in a process of re-layout using the layout model, a simulator may be set to communicate with the layout model. After the layout model outputs the arrangement position of one device, the simulator obtains the arrangement position of the device output by the layout model in real time, and an actuator in the simulator places the device onto the chip to be laid out according to the arrangement position of the device. Further, the abnormality of the layout model is adjusted based on a simulation result of the simulator. Considering that the layout model sequentially outputs the arrangement position of each device, when the layout model outputs the arrangement positions of a plurality of devices, and the simulator has not finished placing the first device, a plurality of actuators may be disposed in the simulator, and each actuator places one device. But there should not be too many actuators, which prevents the actuators from lying idle and avoid waste of resources.

Figure 7:
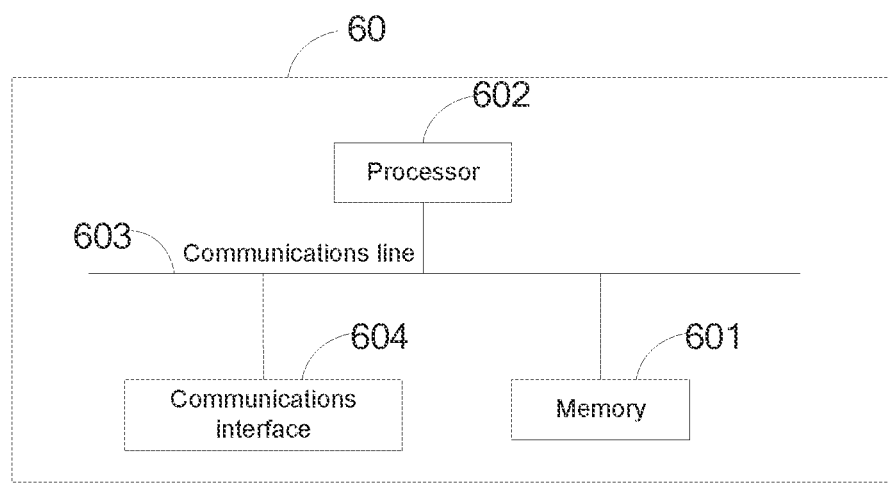
FIG. 7 shows a block diagram of an electronic equipment, in accordance with some embodiments.

Some embodiments of the present disclosure further provide an electronic equipment 60. As shown in FIG. 7, the electronic equipment 60 includes at least a memory 601 and at least one processor 602. The memory 601 stores thereon computer instructions executable on the processor 602. The computer instructions, when executed by the at least one processor 602, cause the at least one processor 602 to perform one or more steps in the layout method of a chip provided in the above.

The electronic equipment 60 provided by the embodiments of the present disclosure performs chip layout by using the pre-trained layout model, and may quickly obtain the layout diagram of the chip to be laid out through the logic diagram and the device list. Compared with the manual chip layout, the electronic equipment 60 may greatly shorten time required for chip layout and improve an efficiency of chip layout. In addition, a large amount of machine operations are performed using the pre-trained layout model, and compared with the manual calculation, the accuracy is higher, that is, the accuracy of the chip layout is improved. Further, there are some irreversible operations, for example, the device is disposable, that is, the device cannot be detached for reuse after being placed on the chip to be laid out. Hence, a higher accuracy of the chip layout may avoid some irreversible operations to a certain extent, material waste is avoided, and the costs are saved.

It will be noted that a principle of solving a problem by the electronic equipment 60 is similar to a principle of solving a problem by the above layout method. For the implementation of the electronic equipment 60, reference may be made to the relevant description of the method embodiments.

In some examples, as shown in FIG. 6, the electronic equipment 60 may also include a communications line 603 and a communications interface 604.

The communications line 603 is configured to transmit information between the processor 602 and the memory 601. The communications line 603 may be, for example, a system bus.

The communications interface 604 is configured to communicate with other devices or communications networks. The communications network may be an Ethernet, a radio access network (RAN), or a wireless local area network (WLAN). The communications interface 604 may be a UART (e.g., RS232/485 interface), a CAN bus, and an I2C bus.

For example, the processor 602 may be a chip. For example, the processor 602 may be a field programmable gate array (FPGA), an application specific integrated circuit (ASIC), a system on chip (SoC), a central processing unit (CPU), a network processor (NP), a digital signal processing (DSP), a microcontroller (MCU), a programmable logic device (PLD), or other integrated chips.

The memory 601 may be integrated in the processor 602, or separate with the processor 602. In the case where the memory 601 is separate with the processor 602, the memory 601 is connected to the processor 602 via the communications line 603. The memory 601 may be a volatile memory or nonvolatile memory, or may include both the volatile memory and the nonvolatile memory. The non-volatile memory may be a read-only memory (ROM), a programmable ROM (PROM), an erasable PROM (EPROM), an electrically EPROM (EEPROM), or a flash memory. The volatile memory may be a random access memory (RAM), which is used as an external cache. By way of exemplary but not restrictive description, many forms of RAM are available, such as a static RAM (SRAM), a dynamic RAM (DRAM), a synchronous DRAM (SDRAM), a double data rate SDRAM (DDR SDRAM), and an enhanced SDRAM (ESDRAM). It will be noted that the memories of the systems and the devices described herein are intended to include, but are not limited to, these and any other suitable types of memories.

In some embodiments, the computer instructions, when executed by the at least one processor 602, cause the at least one processor 602 to perform:

obtaining first attribute data of the chip to be laid out, second attribute data of each device in the device list, and wiring rules; and determining the layout diagram of the chip to be laid out, according to the pre-trained layout model, the logic diagram, the device list, the first attribute data, the second attribute data, and the wiring rules.

The first attribute data includes at least an area of the chip to be laid out. Optionally, the first attribute data may further include the size of the chip to be laid out. The second attribute data of a device includes at least power consumption of the device, performance of the device, and a size of the device.

In some embodiments, the computer instructions, when executed by the at least one processor 602, cause the at least one processor 602 to perform:

inputting the logic diagram, the device list, the first attribute data, the second attribute data, and the wiring rules into the pre-trained layout model, and running the pre-trained layout model to obtain the arrangement position of each device in the chip to be laid out; and determining the layout diagram, according to the arrangement position of each device in the chip to be laid out.

In some embodiments, the computer instructions, when executed by the at least one processor 602, cause the at least one processor 602 to further perform:

obtaining K sample logic diagrams, K sample device lists that are corresponding to the K sample logic diagrams respectively, and the K sample layout diagrams that are corresponding to the K sample logic diagrams respectively; and training a preset initial layout model with the K sample logic diagrams, the K sample device lists, and the K sample layout diagrams to obtain a layout model, wherein the lay out model is the pre-trained layout model.

In some embodiments, the computer instructions, when executed by the at least one processor 602, cause the at least one processor 602 to perform:

for each of the K sample logic diagrams,
determining an operation type of each sample operation in the sample logic diagram, input or output of each sample operation, and corresponding devices of each sample operation;
obtaining a sample device sub-list corresponding to each type of samples operation, according to the operation type and the corresponding devices of each sample operation;
for each sample operation in the sample logic diagram, determining cascade information of the sample operation, according to the operation type of the sample operation, the input or output of the sample operation, and a sample device sub-list corresponding to a type of sample operation to which the sample operation belongs; and
determining a training layout diagram corresponding to the sample logic diagram, according to the cascade information of each sample operation in the sample logic diagram and a layout model of previous training iteration;
calculating a training error, according to K training layout diagrams that are corresponding to the K sample logic diagrams respectively, and the K sample layout diagrams;
in response to the training error being greater than a preset error, adjusting the layout model of the previous training iteration to obtain a layout model of current training iteration, the layout model of current training iteration being used in next training iteration; and performing a plurality of training iterations until a training error obtained in a training iteration is less than or equal to the preset error, a layout model of a previous training iteration of the training iteration being the pre-trained layout model.

In some embodiments, the computer instructions, when executed by the at least one processor 602, cause the at least one processor 602 to perform:

adjusting model parameters of the layout model of the previous training iteration with a preset formula, so as to obtain the layout model of the current training iteration.

The preset formula includes:

$$\nabla_u J(u) = \frac{1}{K} \sum_{i=1}^{K} \left( \sqrt{r(P_i)} - B \right) \cdot \nabla_u \log_p(P_i \mid G; u);$$

where K is a number of the sample logic diagrams; $r(P_i)$ is a sample layout duration of a layout based on the i-th sample logic diagram; B is a time baseline of the i-th sample logic diagram; and u is input or output of a sample operation in the i-th of the sample logic diagram.

In some embodiments, the computer instructions, when executed by the at least one processor 602, cause the at least one processor 602 to further perform:

determining a layout duration corresponding to the chip to be laid out;

in a case where a difference between the layout duration and the time baseline of the logic diagram is greater than a preset threshold, obtaining a plurality of historical layout durations; and updating the model parameters of the layout model according to the plurality of historical layout durations.

Some embodiments of the present disclosure further provide a non-transitory computer-readable storage medium, and the non-transitory computer-readable storage medium stores thereon one or more computer programs. The one or more computer programs include computer instructions that, when executed by a processor, cause the processor to perform one or more steps in the layout method provided by any of the embodiments of the present disclosure.

The storage medium may be included in the electronic equipment 60, or may exist separately without being assembled into the electronic equipment 60.

It will be noted that the non-transitory readable storage medium of the present disclosure may be a computer-readable signal medium or a non-transitory computer-readable storage medium or any combination of the two. The non-transitory computer-readable storage medium may be, for example, but not limited to, an electronic, magnetic, optical, electromagnetic, infrared, or semiconductor system, apparatus, or device, or a combination of any of the foregoing. For example, the non-transitory computer-readable storage medium may include, but is not limited to: an electrical connection with one or more wires, a portable computer disk, a hard disk, a random access memory (RAM), a read-only memory (ROM), an erasable programmable read-only memory (EPROM or a flash memory), an optical fiber, a portable compact disc read-only memory (CD-ROM), an optical storage device, a magnetic storage device, or any suitable combination of the above. In the embodiments of the present disclosure, the computer-readable storage medium may be any tangible medium that contains, or stores a program that may be used by or in connection with an instruction execution system, apparatus, or device. The computer-readable signal medium may include a data signal propagated in baseband or as part of a carrier wave, in which a computer-readable program code is carried. Such a propagated data signal may take any of a variety of forms, including but not limited to, electromagnetic signal, optical signal, or any suitable combination of the above. The computer-readable signal medium may also be any storage medium other than the computer-readable storage medium, which may transmit, propagate, or transport the program that is used by or in connection with the instruction execution system, apparatus, or device. The program code embodied on the storage medium may be transmitted using any suitable medium, including but not limited to: electrical wires, optical cables, radio frequency (RF), or any suitable combination of the above.

Some embodiments of the present disclosure further provide a computer program product. The computer program product includes computer instructions stored in a non-transitory computer-readable storage medium. The computer instructions, when executed on a computer, cause the computer to perform one or more steps in the layout method provided by any of the method embodiments of the present disclosure.

The flow diagrams and block diagrams in the drawings illustrate the architecture, functions, and operation of possible implementations of systems, methods and computer program products according to various embodiments of the present disclosure. In this regard, each block in the flow diagrams or block diagrams may represent a module, program segment, or portion of code, and the module, program segment, or portion of code includes one or more executable instructions for implementing the specified logical functions. It will also be noted that, in some alternative implementations, the functions noted in the block may occur in an order different from the order noted in the drawings. For example, two blocks shown in succession may, in fact, be performed substantially simultaneously, or the blocks may sometimes be performed in the reverse order, depending upon the functions involved. It will also be noted that each block of the block diagram and/or flow diagram, and a combination of blocks in the block diagram and/or flow diagram, may be implemented by a dedicated hardware-based system that performs the specified functions or actions, or a combination of dedicated hardware and computer instructions.

The units described in the present disclosure may be implemented by software or hardware. A name of a unit does not constitute a limitation on the unit itself in some cases.

The functions described herein above may be performed at least in part by one or more hardware logic components. For example, without limitation, exemplary categories of hardware logic components that may be used include: a field programmable gate array (FPGA), an application specific integrated circuit (ASIC), an application specific standard product (ASSP), a system on a chip (SOC), and a complex programmable logic device (CPLD).

The above descriptions are only better embodiments of the present disclosure and explanations of the principles of the technology employed. It will be appreciated by those skilled in the art that the scope of the present disclosure is not limited to the technical solutions formed by particular combinations of technical features described above, but also encompasses other technical solutions formed by any combination of the technical features described above or equivalents thereof without departing from the concept of the present disclosure, for example, the technical solutions formed by replacing the above features and the technical features disclosed in the present disclosure (but not limited to) having similar functions.

Furthermore, while operations are described in a particular order, it should not be understood as requiring that such operations be performed in the particular order shown or in a sequential order. Under certain circumstances, multitasking and parallel processing may be advantageous. Likewise, while several specific implementation details are included in the above discussion, these should not be construed as limitations on the scope of the present disclosure. Certain features described in the context of a single embodiment may also be implemented in combination in the single embodiment. Conversely, various features described in the context of the single embodiment may also be implemented in multiple embodiments separately or in any suitable sub-combination.

Although the subject matter has been described in language specific to structural features and/or logical actions of method, it should be understood that the subject matter defined in the appended claims may not be limited to the specific features or actions described above. Rather, the specific features and actions described above are only an example of implementing the claims.

The multiple embodiments of the present disclosure have been described in detail, but the present disclosure is not limited to these specific embodiments, and a person of ordinary skill in the art can made many variations and modifications on the basis of the concept of the present disclosure, all of which shall fall within the protection scope of the present disclosure.

What is claimed is:

1. A layout method of a chip, comprising:
    determining a logic diagram corresponding to a chip to be laid out and a device list corresponding to the logic diagram; and
    determining a layout diagram of the chip to be laid out, according to the logic diagram, the device list, and a pre-trained layout model;
    wherein the layout diagram includes at least an arrangement position, in the chip to be laid out, of each device in the device list,
    wherein the determining the layout diagram of the chip to be laid out. according to the logic diagram, the device list, and the pre-trained layout model includes:
        obtaining first attribute data of the chip to be laid out, second attribute data of each device in the device list, and wiring rules; and
        determining the layout diagram of the chip to be laid out, according to the pre- trained layout model, the logic diagram, the device list, the first attribute data, the second attribute data, and the wiring rules,
        wherein the first attribute data includes at least an area of the chip to be laid out;
        second attribute data of a device includes at least power consumption of the device, performance of the device, and a size of the device; and
        the wiring rules includes at least a wiring density, an interconnection principle, and a non-crossing principle.

2. The method according to claim 1, wherein the determining the layout diagram of the chip to be laid out, according to the pre-trained layout model, the logic diagram, the device list, the first attribute data, the second attribute data, and the wiring rules includes:
    inputting the logic diagram, the device list, the first attribute data, the second attribute data, and the wiring rules into the pre-trained layout model, and running the pre-trained layout model to obtain the arrangement position of each device in the chip to be laid out; and
    determining the layout diagram, according to the arrangement position of each device in the chip to be laid out.

3. The method according to claim 1, before the determining the layout diagram of the chip to be laid out, according to the logic diagram, the device list, and the pre-trained layout model, the method further comprising:
    obtaining K sample logic diagrams, K sample device lists that are corresponding to the K sample logic diagrams respectively, and K sample layout diagrams that are corresponding to the K sample logic diagrams respectively; and
    training a preset initial layout model with the K sample logic diagrams, the K sample device lists, and the K sample layout diagrams to obtain a layout model, wherein the lay out model is the pre-trained layout model.

4. The method according to claim 3, wherein the training the preset initial layout model with the K sample logic diagrams, the K sample device lists, and the K sample layout diagrams to obtain the layout model includes:
    for each of the K sample logic diagrams,
        determining an operation type of each sample operation in the sample logic diagram, input or output of each sample operation, and corresponding devices of each sample operation;
        obtaining a sample device sub-list corresponding to each type of samples operation, according to the operation type and the corresponding device of each sample operation;
        for each sample operation in the sample logic diagram, determining cascade information of the sample operation, according to the operation type of the sample operation, the input or output of the sample operation, and a sample device sub-list corresponding to a type of sample operations to which the sample operation belongs; and
        determining a training layout diagram corresponding to the sample logic diagram, according to the cascade information of each sample operation in the sample logic diagram and a layout model of previous training iteration;
    calculating a training error, according to K training layout diagrams that are corresponding to the K sample logic diagrams respectively, and the K sample layout diagrams;
    in response to the training error being greater than a preset error, adjusting the layout model of the previous training iteration to obtain a layout model of current training iteration, the layout model of current training iteration being used in next training iteration; and
    performing a plurality of training iterations until a training error obtained in a training iteration is less than or equal to the preset error, a layout model of a previous training iteration of the training iteration being the pre-trained layout model.

5. The method according to claim 4, wherein the adjusting the layout model of the previous training iteration to obtain the layout model of the current training iteration includes:
    adjusting model parameters of the layout model of the previous training iteration with a preset formula, so as to obtain the layout model of the current training iteration; and
    the preset formula includes:

$$\nabla_u J(u) = \frac{1}{K} \sum_{i=1}^{K} \left( \sqrt{r(P_i)} - B \right) \cdot \nabla_u \log_p(P_i \mid G; u),$$

where K is a number of the sample logic diagrams; r(P$_i$) is a sample layout duration of a layout based on an i-th sample logic diagram; B is a time baseline of the i-th sample logic diagram; and u is input or output of a sample operation in the i-th sample logic diagram.

6. The method according to claim 1, further comprising:
determining a layout duration corresponding to the chip to be laid out;
in a case where a difference between the layout duration and a time baseline of the logic diagram is greater than a preset threshold, obtaining a plurality of historical layout durations; and
updating model parameters of the layout model, according to the plurality of historical layout durations.

7. An electronic equipment, comprising:
at least one processor, a memory, and computer instructions stored in the memory and executable on the at least one processor, wherein the computer instructions, when executed by the at least one processor, cause the at least one processor to perform:
determining a logic diagram corresponding to a chip to be laid out and a device list corresponding to the logic diagram;
obtaining first attribute data of the chip to be laid out, second attribute data of each device in the device list, and wiring rules; and
determining a layout diagram of the chip to be laid out, according to a pre-trained layout model, the logic diagram, the device list, the first attribute data, the second attribute data, and the wiring rules,
wherein the layout diagram includes at least an arrangement position, in the chip to be laid out, of each device in the device list; the first attribute data includes at least an area of the chip to be laid out; second attribute data of a device includes at least power consumption of the device, performance of the device, and a size of the device; and the wiring rules includes at least a wiring density. an interconnection principle, and a non-crossing principle.

8. The electronic equipment according to claim 7, wherein the computer instructions, when executed by the at least one processor, cause the at least one processor to perform;
inputting the logic diagram, the device list, the first attribute data, the second attribute data, and the wiring rules into the pre-trained layout model, and running the pre-trained layout model to obtain the arrangement position of each device in the chip to be laid out; and
determining the layout diagram, according to the arrangement position of each device in the chip to be laid out.

9. The electronic equipment according to claim 7, wherein the computer instructions, when executed by the at least one processor, cause the at least one processor to further perform:
obtaining K sample logic diagrams, K sample device lists that are corresponding to the K sample logic diagrams respectively, and K sample layout diagrams that are corresponding to the K sample logic diagrams respectively; and
training a preset initial layout model with the K sample logic diagrams, the K sample device lists, and the K sample layout diagrams to obtain a layout model, wherein the lay out model is the pre-trained layout model.

10. The electronic equipment according to claim 9, wherein the computer instructions, when executed by the at least one processor, cause the at least one processor to perform:
for each of the K sample logic diagrams,
determining an operation type of each sample operation in the sample logic diagram, input or output of each sample operation, and corresponding devices of each sample operation;
obtaining a sample device sub-list corresponding to each type of samples operation, according to the operation type and the corresponding devices of each sample operation;
for each sample operation in the sample logic diagram, determining cascade information of the sample operation, according to the operation type of the sample operation, the input or output of the sample operation, and a sample device sub-list corresponding to a type of sample operation to which the sample operation belongs; and
determining a training layout diagram corresponding to the sample logic diagram, according to the cascade information of each sample operation in the sample logic diagram and a layout model of previous training iteration;
calculating a training error, according to K training layout diagrams that are corresponding to the K sample logic diagrams respectively, and the K sample layout diagrams;
in response to the training error being greater than a preset error, adjusting the layout model of the previous training iteration to obtain a layout model of current training iteration, the layout model of current training iteration being used in next training iteration; and
performing a plurality of training iterations until a training error obtained in a training iteration is less than or equal to the preset error, a layout model of a previous training iteration of the training iteration being the pre-trained layout model.

11. The electronic equipment according to claim 10, wherein the computer instructions, when executed by the at least one processor, cause the at least one processor to perform:
adjusting model parameters of the layout model of the previous training iteration with a preset formula, so as to obtain the layout model of the current training iteration; and
the preset formula includes:

$$\nabla_u J(u) = \frac{1}{K} \sum_{i=1}^{K} \left( \sqrt{r(P_i)} - B \right) \cdot \nabla_u \log_p(P_i \mid G; u),$$

where K is a number of the sample logic diagrams; r(P$_i$) is a sample layout duration of a layout based on an i-th sample logic diagram; B is a time baseline of the i-th sample logic diagram; and
u is input or output of a sample operation in the i-th sample logic diagram.

12. The electronic equipment according to claim 7, wherein the computer instructions, when executed by the at least one processor, cause the at least one processor to further perform:

determining a layout duration corresponding to the chip to be laid out;

in a case where a difference between the layout duration and a time baseline of the logic diagram is greater than a preset threshold, obtaining a plurality of historical layout durations, and updating model parameters of the layout model, according to the plurality of historical layout durations.

13. A non-transitory computer-readable storage medium, storing thereon one or more computer programs, wherein the one or more computer programs include computer instructions that, when executed by a processor, cause the processor to perform;

determining a logic diagram corresponding to a chip to be laid out and a device list corresponding to the logic diagram;

obtaining first attribute data of the chip to be laid out, second attribute data of each device in the device list, and wiring rules; and determining a layout diagram of the chip to be laid out, according to a pre-trained layout model, the logic diagram, the device list, the first attribute data, the second attribute data, and the wiring rules, wherein the layout diagram includes at least an arrangement position. in the chip to be laid out, of each device in the device list; the first attribute data includes at least an area of the chip to be laid out; second attribute data of a device includes at least power consumption of the device, performance of the device, and a size of the device; and the wiring rules includes at least a wiring density, an interconnection principle, and a non-crossing principle.

\* \* \* \* \*

UNITED STATES PATENT AND TRADEMARK OFFICE
CERTIFICATE OF CORRECTION

| | |
|---|---|
| PATENT NO. | : 12,045,552 B2 |
| APPLICATION NO. | : 17/396285 |
| DATED | : July 23, 2024 |
| INVENTOR(S) | : Qianwen Jiang et al. |

It is certified that error appears in the above-identified patent and that said Letters Patent is hereby corrected as shown below:

In the Claims

In Column 17, Claim 7, Line 26: ";" after "perform" should be replaced by a ":".

In Column 19, Claim 13, Line 13: ";" after "perform" should be replaced by a ":".

Signed and Sealed this
Eighth Day of October, 2024

Katherine Kelly Vidal
*Director of the United States Patent and Trademark Office*